(12) United States Patent
Xing

(10) Patent No.: US 10,797,299 B2
(45) Date of Patent: Oct. 6, 2020

(54) ELECTRODE PLATE AND SURFACE TREATMENT METHOD THEREOF

(71) Applicant: Wuhan China Star Optoelectronics Semiconductor Display Technology Co., Ltd., Wuhan, Hubei (CN)

(72) Inventor: Shengyang Xing, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 345 days.

(21) Appl. No.: 15/749,071

(22) PCT Filed: Jan. 4, 2018

(86) PCT No.: PCT/CN2018/071431
§ 371 (c)(1),
(2) Date: Jan. 30, 2018

(87) PCT Pub. No.: WO2019/114060
PCT Pub. Date: Jun. 20, 2019

(65) Prior Publication Data
US 2020/0091497 A1  Mar. 19, 2020

(30) Foreign Application Priority Data
Dec. 14, 2017  (CN) .......................... 2017 1 1340305

(51) Int. Cl.
H01M 4/04  (2006.01)
H01M 4/46  (2006.01)
(Continued)

(52) U.S. Cl.
CPC ............. *H01M 4/0428* (2013.01); *C23C 8/02* (2013.01); *C23C 8/36* (2013.01); *C23C 16/505* (2013.01); *H01M 4/46* (2013.01)

(58) Field of Classification Search
CPC ......... H01M 4/04; H01M 4/46; C23C 16/505; C23C 8/02; C23C 8/36
See application file for complete search history.

(56) References Cited

FOREIGN PATENT DOCUMENTS

CN  101921981  12/2010
CN  105274499  1/2016
(Continued)

OTHER PUBLICATIONS

Machine Translation of: JP 2006/089821, Harada et al., Apr. 6, 2006.*
(Continued)

*Primary Examiner* — Kenneth J Douyette
(74) *Attorney, Agent, or Firm* — Hemisphere Law, PLLC; Zhigang Ma

(57) ABSTRACT

The disclosure provides an electrode plate and a surface treatment method thereof. The surface treatment method firstly adopts a special annealing process to process the electrode plate to form a Mg film on the surface of the MgAl alloy material layer, and then make the Mg film chemically react with the fluoride ion to form a $MgF_2$ film on the surface of the Mg film or the Mg film is converted into a $MgF_2$ filmentirely. Due to the dense structure and chemical stability of $MgF_2$ film, the fluoride ion corrosion resistance of the electrode plate is improved. The surface of the electrode plate of the disclosure includes a $MgF_2$ film capable of being used as a protective layer to protect the MgAl alloy material layer. Therefore, the electrode plate has excellent corrosion resistance against fluoride ions and can improve the quality of film formation by chemical vapor deposition.

8 Claims, 3 Drawing Sheets

(51) Int. Cl.
C23C 16/505 (2006.01)
C23C 8/08 (2006.01)
C23C 8/02 (2006.01)
C23C 8/36 (2006.01)

(56) References Cited

FOREIGN PATENT DOCUMENTS

| | | |
|---|---|---|
| CN | 105603393 | 5/2016 |
| JP | 2000169953 | 6/2000 |
| JP | 2006089821 | 4/2006 |

OTHER PUBLICATIONS

Machine Translation of: CN 105274499, Huang et al., Jan. 27, 2016.*

* cited by examiner

ELECTRODE PLATE AND SURFACE TREATMENT METHOD THEREOF

RELATED APPLICATIONS

The present application is a National Phase of International Application Number PCT/CN2018/071431, filed on Jan. 4, 2018, and claims the priority of China Application 201711340305.7, filed on Dec. 14, 2017.

FIELD OF THE DISCLOSURE

The disclosure relates to the technical field of chemical vapor deposition, in particular to an electrode plate and a surface treatment method thereof.

BACKGROUND

With the development of vapor deposition technique, a plasma enhanced chemical vapor deposition (PECVD) is more and more applied to the field such as photovoltaic (PV) and thin film transistor.

The operating principle in the PECVD apparatus is that two electrode plates parallel to each other and having a certain pitch are placed in a vacuum environment, one of the two electrode plates connect to a radio frequency (RF) power supply, the other electrode plate is grounded and the RF electric field is generated between the two electrode plates and the substrate to be coated is placed between the two electrode plates; the gas of a coating process firstly passes through the uniform flow chamber for uniform flow, then enters between the two electrode plates; the gas is excited to become a plasma in the role of radio frequency electric field, and the plasma reacts on the substrate surface so as to form a thin film on the substrate surface.

Currently, the electrode plate in the PECVD apparatus is usually a magnesium-aluminum alloy substrate, and the magnesium-aluminum alloy substrate is usually put into a chemical solution such as oxalic acid or sulfuric acid before using, and the surface of the magnesium-aluminum alloy substrate undergoes anodic reaction to form an $Al_2O_3$ film, and the $Al_2O_3$ film as a protective layer can protect the internal material of the magnesium-aluminum alloy substrate.

Since the surface of the electrode plate also deposits a thin film during the chemical vapor deposition process, when the film on the electrode plate reaches a certain thickness, the film will fall off and the falling film on the substrate surface will affect the quality of the substrate coating. Therefore, it is necessary to clean the surface of the electrode plate from time to time to remove the film deposited on the electrode plate. Specifically, the method of cleaning the surface of the electrode plate is that by passing nitrogen trifluoride ($NF_3$) gas into the chamber where the electrode plate is located, ionizing the $NF_3$ gas to form $NF_3$ plasma, using the $NF_3$ plasma to clean the film deposited on the electrode plate, then the electrode plate will exist for a long time in the environment containing fluoride ions; since the surface of the $Al_2O_3$ film on the surface of the electrode plate is a porous structure, the porous structure in the environment of fluoride ions adsorbs fluoride to form a source of pollution for a long time, And the $Al_2O_3$ film also reacts with fluoride ions to generate AlF3 dust particles on the surface of the $Al_2O_3$ film, The fluoride pollution sources adsorbed on the surface of the $Al_2O_3$ film and the generated AlF3 dust particles are likely to fall on the substrate surface during a subsequent chemical vapor deposition process, thereby reducing the coating quality, so it is necessary to take measures to solve the technical problems.

SUMMARY

An object of the disclosure is to provide a surface treatment method of an electrode plate, which can improve the fluoride ion corrosion resistance of the electrode plate and improve the quality of film formation by chemical vapor deposition.

The object of the disclosure is also to provide an electrode plate with excellent resistance to fluoride ion corrosion, which can improve the quality of film formation by chemical vapor deposition.

To achieve the above object, the disclosure provides a surface treatment method of an electrode plate, including the following steps:

step 1: providing an electrode plate, wherein the electrode plate includes a magnesium-aluminum alloy material layer; annealing the electrode plate to make a part of a magnesium element be precipitated from the magnesium-aluminum alloy material layer to form a magnesium film on the surface of the magnesium-aluminum alloy material layer;

step 2: arranging the electrode plate in a closed chamber, introducing a plasma containing fluorine ions into the closed chamber and the magnesium film on the surface of the electrode plate chemically reacts with fluorine ions and form a magnesium fluoride film on the surface of the electrode plate.

In the step 2, when the magnesium film completely reacts, the magnesium film is converted into a magnesium fluoride film entirely.

In the step 1, an annealing temperature of the electrode plate is from 500° C. to 700° C., and a heat preservation time is from 30 minutes to 2 hours.

The content of the magnesium element in the magnesium-aluminum alloy material layer is 0.2 wt % to 2 wt %.

A thickness of the magnesium film obtained in the step 1 is from 5 to 10 μm.

In the step 2, a plasma containing fluorine ion is a plasma of fluorine-containing gas; and the fluorine-containing gas includes one or more of $NF_3$ and $SF_6$.

The electrode plate is an electrode plate configured to generate a radio frequency electric field in a PECVD apparatus, and a number of the electrode plates is two and the two electrode plates are oppositely arranged to each other;

the specific operation of the step 2 is as follows: introducing a fluorine-containing gas into the PECVD apparatus and energizing the two electrode plates oppositely arranged to each other to make the two electrode plates generate the radio frequency electric field, then the fluorine-containing gas dissociates into a plasma containing fluorine ions under an action of the radio frequency electric field, and the magnesium film on surfaces of the two electrode plates chemically reacts with fluorine ions to form a magnesium fluoride film on the surface of the two electrode plates.

The disclosure also provides an electrode plate including a magnesium fluoride film on a surface of the electrode plate and a magnesium-aluminum alloy material layer under the magnesium fluoride film.

The magnesium fluoride film is disposed on a surface of the magnesium alloy material layer, and a thickness of the magnesium fluoride film is from 5 to 10 μm.

A magnesium film is further disposed between the magnesium-aluminum alloy material layer and the magnesium fluoride film, and a total thickness of the magnesium film and the magnesium fluoride film is from 5 to 10 μm.

The disclosure further provides a surface treatment method of an electrode plate, including the following steps:

step 1: providing an electrode plate, wherein the electrode plate includes a magnesium-aluminum alloy material layer;

annealing the electrode plate to make a part of a magnesium element be precipitated from the magnesium-aluminum alloy material layer to form a magnesium film on the surface of the magnesium-aluminum alloy material layer;

step 2: arranging the electrode plate in a closed chamber, introducing a plasma containing fluorine ions into the closed chamber and the magnesium film on the surface of the electrode plate chemically reacts with fluorine ions and forms a magnesium fluoride film on the surface of the electrode plate;

in the step 2, when the magnesium film completely reacts, the magnesium film is converted into a magnesium fluoride film entirely;

in the step 1, an annealing temperature of the electrode plate is from 500° C. to 700° C., and a heat preservation time is from 30 minutes to 2 hours;

a content of the magnesium element in the magnesium-aluminum alloy material layer is 0.2 wt % to 2 wt %; and a thickness of the magnesium film obtained in the step 1 is from 5 to 10 μm.

The beneficial effect of the disclosure is that the surface treatment method of the electrode plate of the disclosure firstly adopts a special annealing process to process the electrode plate to form a magnesium film on the surface of the magnesium-aluminum alloy material layer, and then make the magnesium film chemically react with the fluoride ion to form a magnesium-fluoride film on the surface of the magnesium film or the magnesium film is converted into a magnesium-fluoride filmentirely, and the magnesium fluoride film can be used as a protective layer to protect the magnesium-aluminum alloy material layer; due to the dense structure and chemical stability of magnesium fluoride film, so as to improve the fluoride ion corrosion resistance of the electrode plate and improve the film formation quality by chemical vapor deposition. The surface of the electrode plate of the disclosure includes a magnesium fluoride film capable of being used as a protective layer to protect the magnesium-aluminum alloy material layer, and therefore, the electrode plate has excellent corrosion resistance against fluoride ions and can improve the quality of film formation by chemical vapor deposition.

For further understanding of the features and technical contents of the disclosure, reference should be made to the following detailed description and accompanying drawings of the disclosure. However, the drawings are for reference only and are not intended to limit the disclosure.

BRIEF DESCRIPTION OF THE DRAWINGS

The technical proposal of the disclosure and other advantageous effects will be apparent from the following detailed description of specific embodiments of the disclosure taken in conjunction with the accompanying drawings.

In the drawings.

DETAILED DESCRIPTION OF PREFERRED EMBODIMENTS

To further illustrate the technical means adopted by the disclosure and the effects thereof, the following describes in detail the preferred embodiments of the disclosure and the accompanying drawings.

Figure 1:
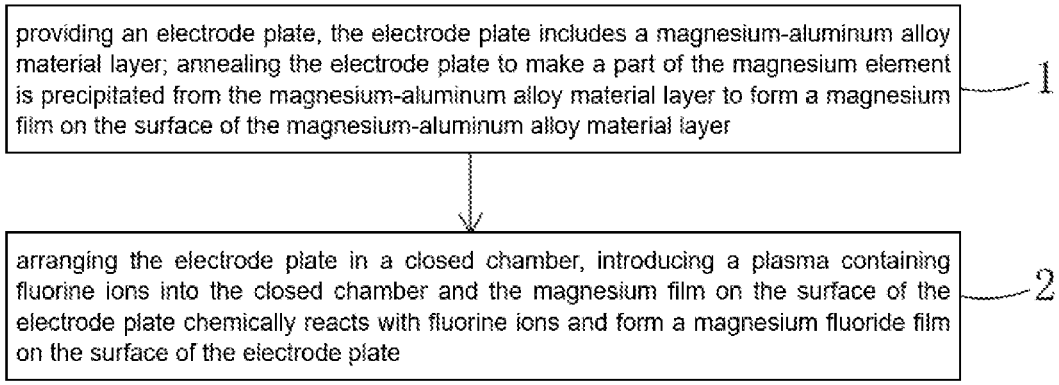
FIG. 1 is a flow chart of a surface treatment method of an electrode plate according to the disclosure.
Figure 2:
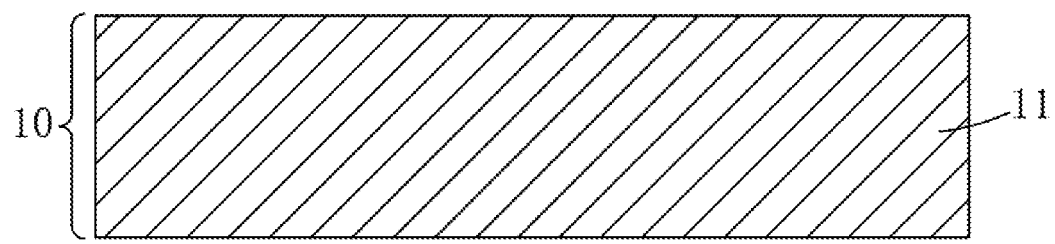
FIGS. 2 and 3 are schematic diagram of step 1 of the surface treatment method of the electrode plate according to the disclosure.
Figure 3:
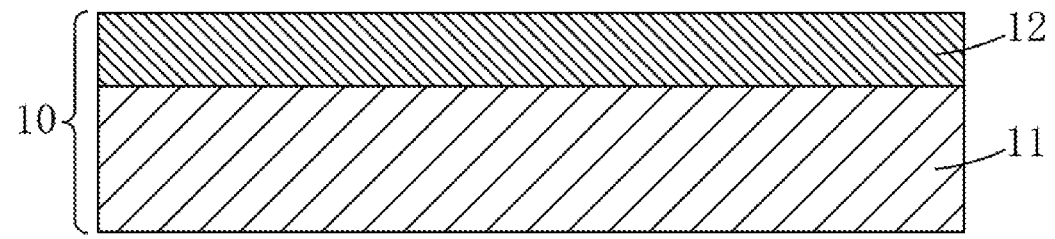

Referring to FIG. 1, the disclosure provides a surface treatment method of an electrode plate, including the following steps:

step 1: as shown in FIGS. 2 and 3, providing an electrode plate 10, and the electrode plate 10 includes a magnesium-aluminum (MgAl) alloy material layer 11;

annealing the electrode plate 10 to make a part of the Mg element be precipitated from the MgAl alloy material layer to form a Mg film on the surface of the MgAl alloy material layer.

Specifically, in the step 1, an annealing temperature of the electrode plate is from 500° C. to 700° C., and a heat preservation time is from 30 minutes to 2 hours, preferably 1 hour.

Specifically, in the MgAl alloy material layer 11, the content of Mg element is 0.2 wt % to 2 wt %, and usually about 1 wt %.

Specifically, the Mg film 12 obtained in the step 1 has a thickness of 5 to 10 μm.

Figure 4A:
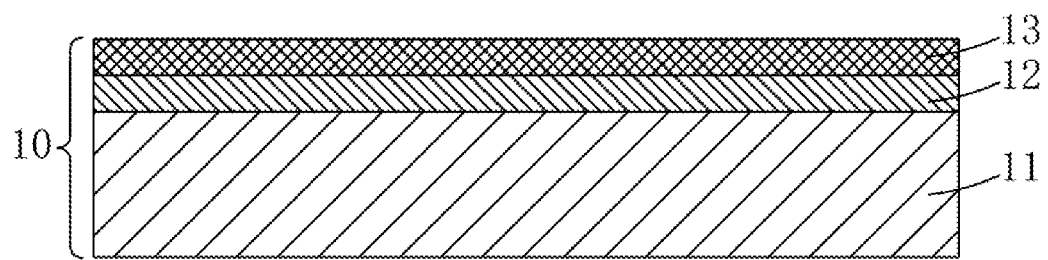
FIG. 4A is a schematic diagram of a first embodiment of the step 2 of the surface treatment method of the electrode plate and a schematic diagram of a structure of the first embodiment of the electrode plate according to the disclosure.
Figure 4B:
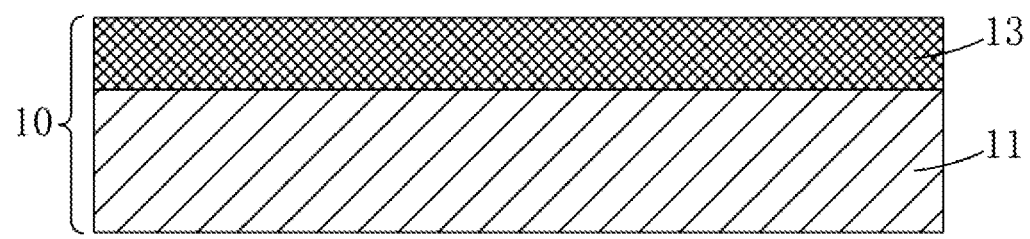
FIG. 4B is a schematic diagram of a second embodiment of the step 2 of the surface treatment method of the electrode plate and a schematic diagram of a structure of the second embodiment of the electrode plate according to the disclosure.

Step 2: as shown in FIGS. 4A and 4B, arranging the electrode plate 10 in a closed chamber, introducing a plasma containing fluorine ions into the closed chamber and the Mg film 12 on the surface of the electrode plate 10 chemically reacts with fluorine ions and forms a magnesium fluoride ($MgF_2$) film 13 on the surface of the electrode plate 10.

Specifically, in the step 2, when the Mg film 12 completely reacts, the Mg film 12 is converted into the $MgF_2$ film 13 entirely.

The $MgF_2$ film can be used as a protective layer to protect the MgAl alloy material layer; compared with the conventional $Al_2O_3$ protective layer on the surface of the electrode plate, the $MgF_2$ film 13 has a denser structure and no pore structure, and since the chemical properties of $MgF_2$ is more stable, $MgF_2$ will not react with fluoride ions, thereby having a better corrosion resistance.

Specifically, in the step 2, a plasma containing fluorine ion is a plasma of fluorine-containing gas, and the fluorine-containing gas includes one or more of $NF_3$ and $SF_6$.

Specifically, the electrode plate 10 is an electrode plate configured to generate a radio frequency electric field in a PECVD apparatus, and a number of the electrode plates is two and the two electrode plates are oppositely arranged to each other;

the specific operation of the step 2 is as follows: introducing a fluorine-containing gas into the PECVD apparatus and energizing the two electrode plates 10 oppositely arranged to each other to make the two electrode plates 10 generate the radio frequency electric field, then the fluorine-containing gas dissociates into a plasma containing fluorine ions under an action of the radio frequency electric field, and the Mg film 12 on surfaces of the two electrode plates 10 chemically reacts with fluorine ions to form a MgF$_2$ film 13 on the surface of the two electrode plates 10.

Referring to FIGS. 4A and 4B, based on the surface treatment method of the electrode plate, the disclosure further provides an electrode plate 10 including a surface of a MgF$_2$ film 13 and a MgAl alloy material layer 11 under the MgF$_2$ film 13.

As shown in FIG. 4A, in the first embodiment of the electrode plate of the disclosure, the MgF$_2$ film 13 is disposed on the surface of the MgAl alloy material layer 11, and the thickness of the MgF$_2$ film 13 is from 5 to 10 μm.

As shown in FIG. 4B, in the first embodiment of the electrode plate of the disclosure, a Mg film 12 is further disposed between the MgAl alloy material layer 11 and the MgF$_2$ film 13, and a total thickness of the Mg film 12 and the MgF$_2$ film 13 is from 5 to 10 μm.

Specifically, the electrode plate 10 is an electrode plate configured to generate a radio frequency electric field in a PECVD apparatus.

In summary, the disclosure provides an electrode plate and a surface treatment method thereof. The surface treatment method of the electrode plate of the disclosure firstly adopts a special annealing process to process the electrode plate to form a Mg film on the surface of the MgAl alloy material layer, and then make the Mg film chemically react with the fluoride ion to form a MgF$_2$ film on the surface of the Mg film or the Mg film is converted into a MgF$_2$ filmentirely, and the MgF$_2$ film can be used as a protective layer to protect the MgAl alloy material layer; compared with the conventional Al$_2$O$_3$ protective layer on the surface of the electrode plate, the MgF$_2$ film 13 has a denser structure and no pore structure, and since the chemical properties of MgF$_2$ is more stable, MgF$_2$ will not react with fluoride ions, so as to improve the fluoride ion corrosion resistance of the electrode plate and improve the quality of film formation by chemical vapor deposition. The surface of the electrode plate of the disclosure includes a MgF$_2$ film and the MgF$_2$ film can be used as a protective layer to protect the MgAl alloy material layer, and therefore, the electrode plate has excellent corrosion resistance against fluoride ions and can improve the quality of film formation by chemical vapor deposition.

As described above, it will be apparent to those skilled in the art that various other changes and modifications may be made in accordance with the technical solutions and technical concepts of the disclosure, and all such changes and modifications are subject to be included in the scope of protection of the appended claims.

What is claimed is:

1. A surface treatment method of an electrode plate, comprising the following steps:
    step 1: providing an electrode plate, wherein the electrode plate comprises a magnesium-aluminum alloy material layer;
    annealing the electrode plate to make a part of a magnesium element be precipitated from the magnesium-aluminum alloy material layer to form a magnesium film on a surface of the magnesium-aluminum alloy material layer;
    step 2: arranging the electrode plate in a closed chamber, introducing a plasma containing fluorine ions into the closed chamber and the magnesium film on the surface of the electrode plate chemically reacts with fluorine ions and form a magnesium fluoride film on the surface of the electrode plate.

2. The surface treatment method of the electrode plate according to claim 1, wherein in the step 2, when the magnesium film completely reacts, the magnesium film is converted into the magnesium fluoride film entirely.

3. The surface treatment method of the electrode plate according to claim 1, wherein in the step 1, an annealing temperature of the electrode plate is from 500° C. to 700° C., and a heat preservation time is from 30 minutes to 2 hours.

4. The surface treatment method of the electrode plate according to claim 1, wherein a content of the magnesium element in the magnesium-aluminum alloy material layer is from 0.2 wt % to 2 wt %.

5. The surface treatment method of the electrode plate according to claim 1, wherein a thickness of the magnesium film obtained in the step 1 is from 5 to 10 μm.

6. The surface treatment method of the electrode plate according to claim 1, wherein in the step 2, the plasma containing fluorine ion is a plasma of fluorine-containing gas; wherein the fluorine-containing gas comprises one or more of NF$_3$ and SF$_6$.

7. The surface treatment method of the electrode plate according to claim 6, wherein the electrode plate is an electrode plate configured to generate a radio frequency electric field in a PECVD apparatus, and a number of the electrode plates is two and the two electrode plates are oppositely arranged to each other;
    wherein a specific operation of the step 2 is as follows:
        introducing the fluorine-containing gas into the PECVD apparatus and energizing the two electrode plates oppositely arranged to each other to make the two electrode plates generate the radio frequency electric field, then the fluorine-containing gas dissociates into the plasma containing fluorine ions under an action of the radio frequency electric field, and the magnesium film on the surface of the two electrode plates chemically reacts with fluorine ions to form the magnesium fluoride film on the surface of the two electrode plates.

8. The surface treatment method of the electrode plate according to claim 1, wherein after the step 2, the electrode plate comprises the magnesium-aluminum alloy material layer, the magnesium fluoride film, and a magnesium film sandwiched between and in contact with the magnesium-aluminum alloy material layer and the magnesium fluoride film.

* * * * *